(12) United States Patent
Yamada et al.

(10) Patent No.: US 10,366,888 B2
(45) Date of Patent: Jul. 30, 2019

(54) PATTERN FORMING METHOD

(71) Applicants: Tokyo Electron Limited, Tokyo (JP); TOKYO OHKA KOGYO CO., LTD., Kanagawa (JP)

(72) Inventors: Kazuki Yamada, Yamanashi (JP); Masatoshi Yamato, Miyagi (JP); Hidetami Yaegashi, Tokyo (JP); Yoshitaka Komuro, Kanagawa (JP); Takehiro Seshimo, Kanagawa (JP); Katsumi Ohmori, Kanagawa (JP)

(73) Assignees: Tokyo Electron Limited, Tokyo (JP); TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 16/008,392

(22) Filed: Jun. 14, 2018

(65) Prior Publication Data

US 2018/0374695 A1    Dec. 27, 2018

(30) Foreign Application Priority Data

Jun. 22, 2017 (JP) ................................ 2017-122563

(51) Int. Cl.
| | |
|---|---|
| *H01L 21/302* | (2006.01) |
| *H01L 21/027* | (2006.01) |
| *H01L 21/308* | (2006.01) |
| *H01L 21/311* | (2006.01) |

(52) U.S. Cl.
CPC ...... *H01L 21/0273* (2013.01); *H01L 21/0279* (2013.01); *H01L 21/3081* (2013.01); *H01L 21/3086* (2013.01); *H01L 21/3088* (2013.01); *H01L 21/31144* (2013.01)

(58) Field of Classification Search
CPC ............. H01L 21/0273; H01L 21/0279; H01L 21/3081; H01L 21/3086; H01L 21/3088
USPC .......................... 438/694, 696, 699, 717, 736
See application file for complete search history.

(56) References Cited

U.S. PATENT DOCUMENTS

| | | | |
|---|---|---|---|
| 9,768,059 B1 * | 9/2017 | Liu | H01L 21/31144 |
| 9,786,511 B2 * | 10/2017 | Darling | G03F 7/405 |
| 2013/0256265 A1 * | 10/2013 | Darling | G03F 7/0002 |
| | | | 216/49 |

(Continued)

FOREIGN PATENT DOCUMENTS

JP        2013-080169        5/2013

*Primary Examiner* — Binh X Tran
(74) *Attorney, Agent, or Firm* — IPUSA, PLLC

(57) ABSTRACT

A pattern forming method includes forming a first organic film by coating an etching target film with a composition including a polymer including a cross-linkable component, infiltrating an inorganic substance into the first organic film, cross-linking the polymer, forming a second organic film on the first organic film, forming a second organic film pattern by patterning the second organic film, forming a first organic film pattern having a pitch reduced to one-half of a pitch of the second organic film pattern by patterning the first organic film by a self-aligned patterning method that uses the second organic film pattern as a core pattern, forming an etching target film pattern having a pitch reduced to one-half of a pitch of the first organic film pattern by patterning the etching target film by a self-aligned patterning method that uses the first organic film pattern as a core pattern.

17 Claims, 15 Drawing Sheets

(56) References Cited

U.S. PATENT DOCUMENTS

| | | | | |
|---|---|---|---|---|
| 2015/0031207 A1* | 1/2015 | Bencher | ............. | H01L 21/0337 438/696 |
| 2015/0225850 A1* | 8/2015 | Arora | ................ | C23C 16/45525 216/51 |
| 2017/0170017 A1* | 6/2017 | Chan | ................... | H01L 21/0332 |
| 2017/0345679 A1* | 11/2017 | Kwon | ................ | H01L 21/3086 |

\* cited by examiner

FORM FIRST ORGANIC FILM

INFILTRATION + CROSS-LINKING

FORM SECOND ORGANIC FILM

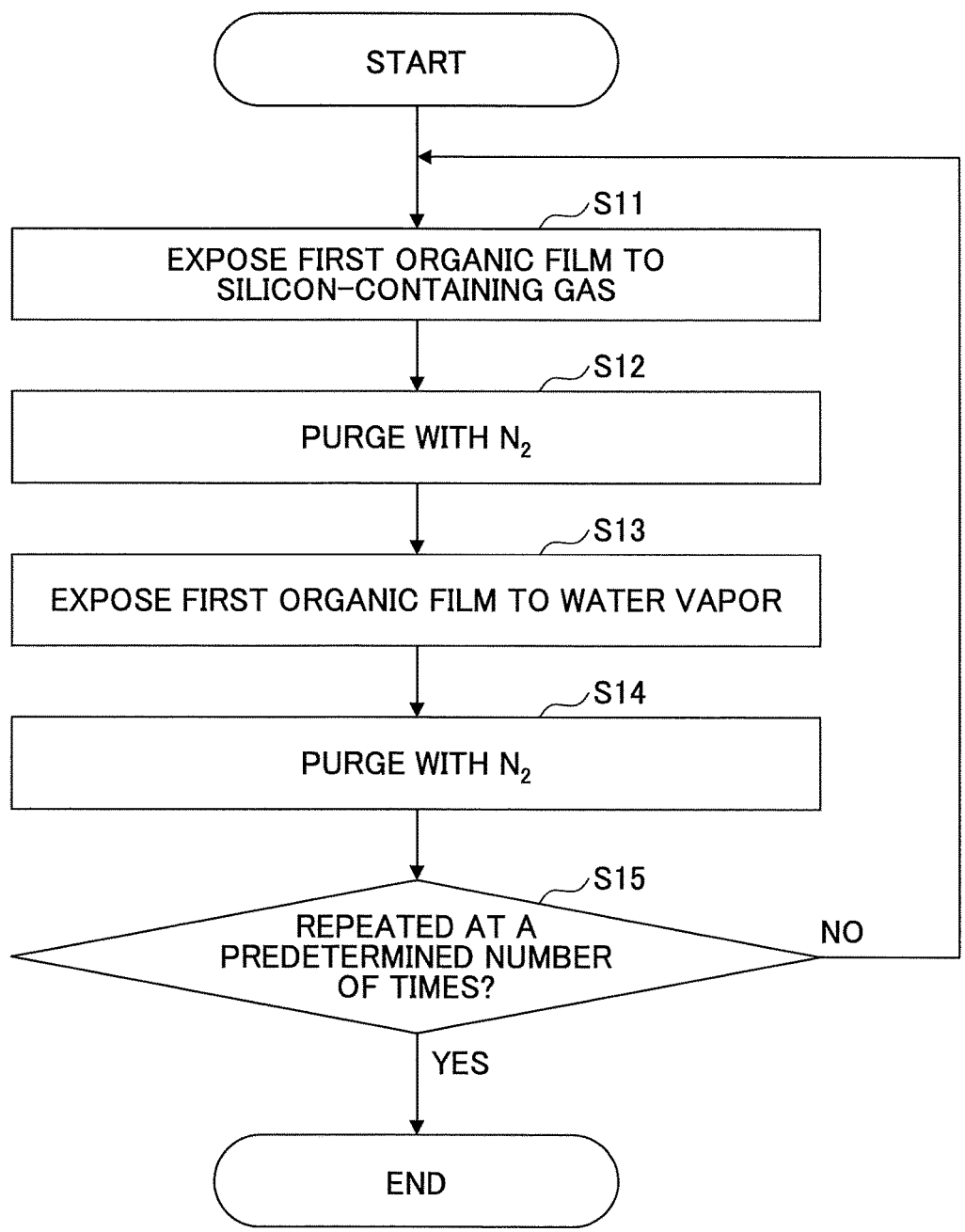

FORM RESIST PATTERN

ETCH SECOND ORGANIC FILM

REMOVE RESIST PATTERN

FIG.5A FORM SILICON OXIDE FILM
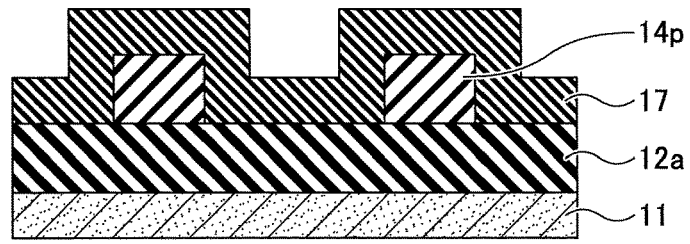
FIG.5B ETCH BACK
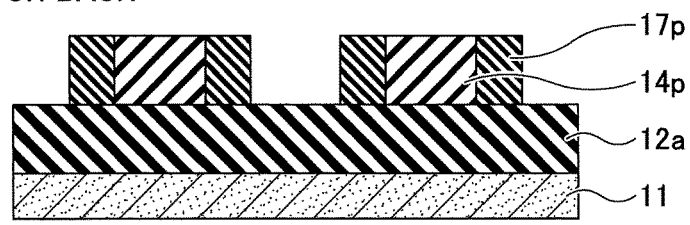
FIG.5C REMOVE SECOND ORGANIC FILM PATTERN
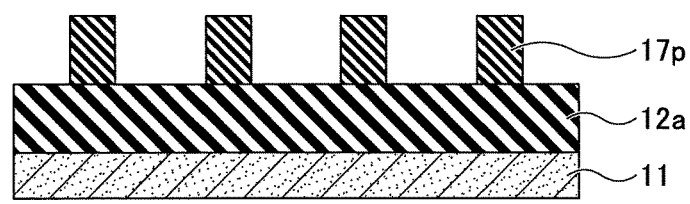
FIG.5D ETCH FIRST ORGANIC FILM
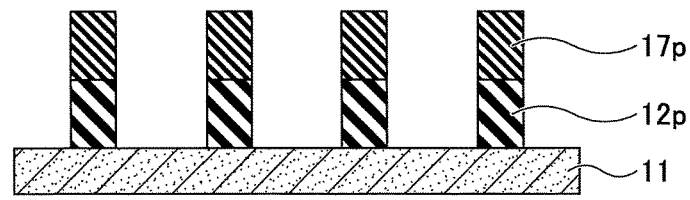
FIG.5E REMOVE SILICON OXIDE FILM
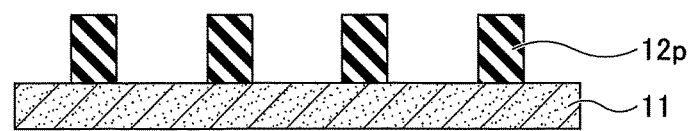

FIG.6A  FORM SILICON OXIDE FILM
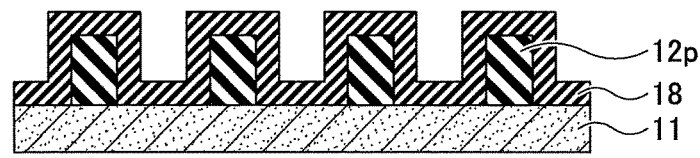
FIG.6B  ETCH BACK
FIG.6C  REMOVE FIRST ORGANIC FILM PATTERN
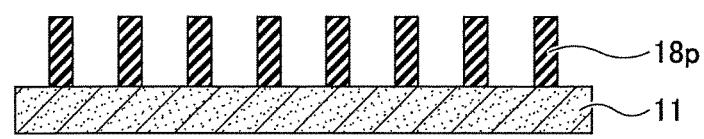
FIG.6D  ETCH ETCHING TARGET FILM
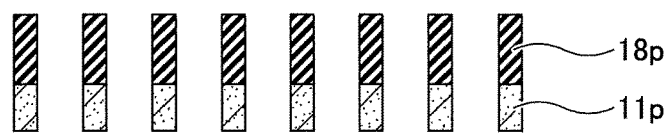
FIG.6E  REMOVE SILICON OXIDE FILM
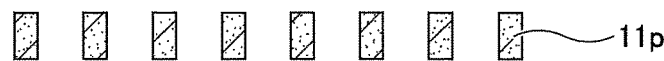

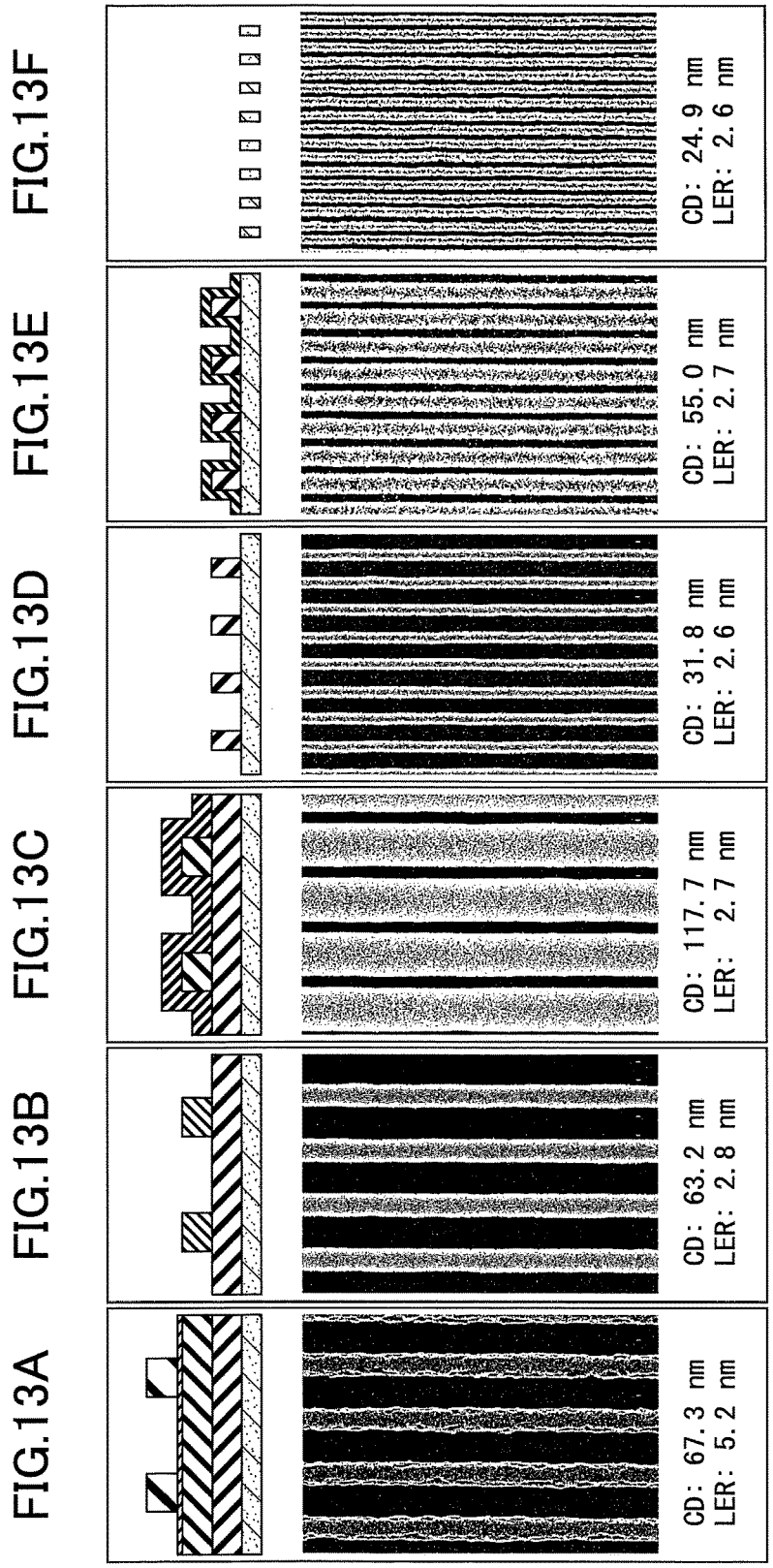

FIG.14A  FORM FIRST ORGANIC FILM
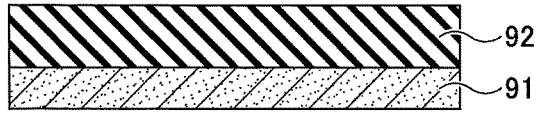
FIG.14B  FORM SILICON OXIDE FILM
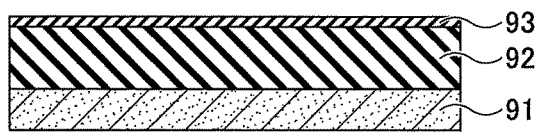
FIG.14C  FORM SECOND ORGANIC FILM
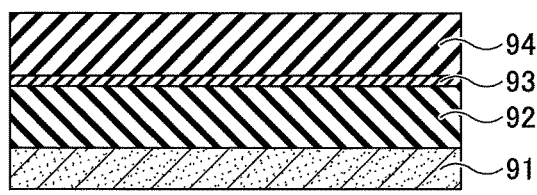
FIG.14D  FORM RESIST PATTERN
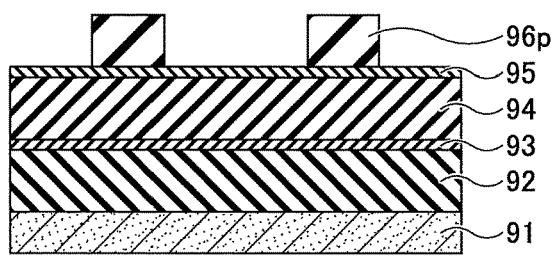
FIG.14E  ETCH SECOND ORGANIC FILM
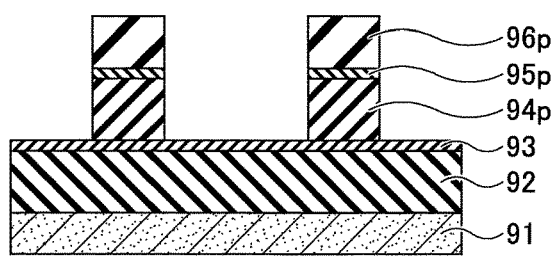
FIG.14F  REMOVE RESIST PATTERN
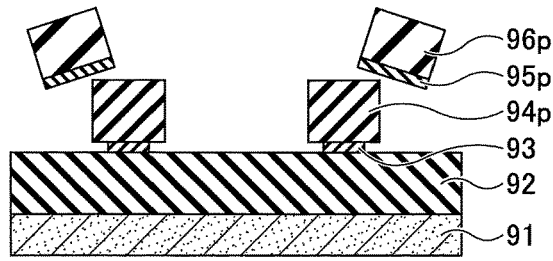

FIG.15A  FORM FIRST ORGANIC FILM
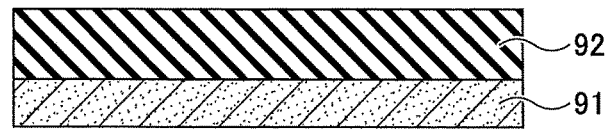
FIG.15B  FORM SECOND ORGANIC FILM
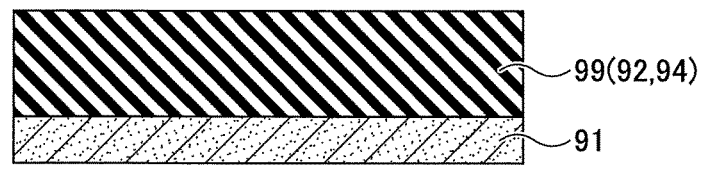
FIG.15C  FORM RESIST PATTERN
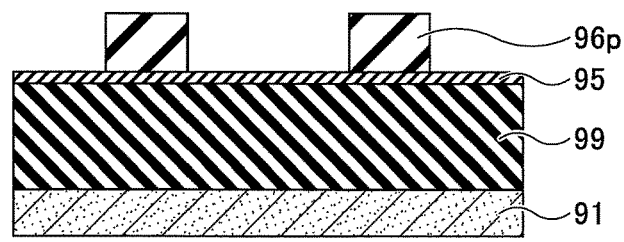
FIG.15D  ETCH MIXED FILM
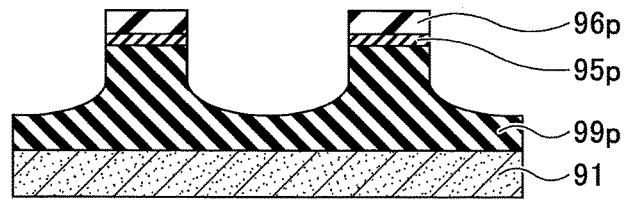

PATTERN FORMING METHOD

CROSS-REFERENCE TO RELATED APPLICATIONS

This patent application is based upon and claims priority to Japanese Patent Application No. 2017-122563 filed on Jun. 22, 2017, the entire contents of which are incorporated herein by reference.

BACKGROUND OF THE INVENTION

1. Field of the Invention

The disclosures herein generally relate to a pattern forming method.

2. Description of the Related Art

Conventionally, a technique called self-aligned multiple patterning is known. In self-aligned multiple patterning, a given thin film is deposited over a line-and-space structure, and portions of the thin film deposited on each side (sidewall) of each line are used. Also, in the self-aligned multiple patterning, even if a line width formed by exposure using a photolithography technique is approximately a critical dimension, a sidewall having a width smaller than such an exposure critical dimension may be formed.

For example, by adjusting a line width and a space width of the line-and-space structure and a thickness of the thin film, a sidewall having a width that is one-half of the original line width can be formed (self-aligned double patterning: SADP). Further, by transferring a pattern of the sidewall to a base film and depositing a given thin film having a predetermined thickness on the base film, a sidewall having a width that is one-fourth of the original line width of the line-and-space structure can be formed (self-aligned quadruple patterning: SAQP).

In this way, the self-aligned multiple patterning allows a pattern having a dimension smaller than the exposure critical dimension by the photolithography technique to be formed.

Conventionally, in patterning using the SAQP, an organic film is used as a line-and-space structure, an inorganic film is used as a base film, and a silicon oxide film is used as a sidewall (see Patent Document 1, for example).

However, in the above-described conventional method, it is difficult to obtain a high etching selectivity between a base film (an inorganic film) and a sidewall (a silicon oxide film). Therefore, line edge roughness (LER) that refers to unevenness of the surface of the sidewall may increase.

RELATED-ART DOCUMENTS

Patent Documents

[Patent Document 1] Japanese Laid-Open Patent Publication No. 2013-80169

SUMMARY OF THE INVENTION

In view of the above, it is an object of one aspect of the present invention to provide a pattern forming method that enables self-aligned multiple patterning with reduced LER.

According to an aspect of at least one embodiment, a pattern forming method includes steps of forming a first organic film by coating an etching target film with a composition including a polymer including a cross-linkable component, infiltrating an inorganic substance into the first organic film, cross-linking the polymer, forming a second organic film on the first organic film after the steps of infiltrating and cross-linking, forming a second organic film pattern by patterning the second organic film, forming a first organic film pattern having a pitch reduced to one-half of a pitch of the second organic film pattern by patterning the first organic film by a self-aligned patterning method that uses the second organic film pattern as a core pattern, forming an etching target film pattern having a pitch reduced to one-half of a pitch of the first organic film pattern by patterning the etching target film by a self-aligned patterning Method that uses the first organic film pattern as a core pattern.

Other objects and further features of the present invention will be apparent from the following detailed description when read in conjunction with the accompanying drawings.

BRIEF DESCRIPTION OF THE DRAWINGS

FIG. 3 is a flowchart illustrating an example of a process of infiltrating a silicon-containing gas into a first organic film;

FIGS. 5A through 5E are schematic cross-sectional views illustrating an example of a process of forming a first organic film pattern;

FIGS. 6A through 6E are schematic cross-sectional views illustrating an example of a process of forming an etching target film pattern;

FIGS. 13A through 13F are diagrams illustrating a pattern having a line-and-space structure formed by using the pattern forming method according to the embodiment;

FIGS. 14A through 14F are cross-sectional views illustrating an example of a conventional pattern forming method; and FIGS. 15A through 15D are cross-sectional views illustrating another example of the conventional pattern forming method.

DESCRIPTION OF THE PREFERRED EMBODIMENTS

Figure 1:
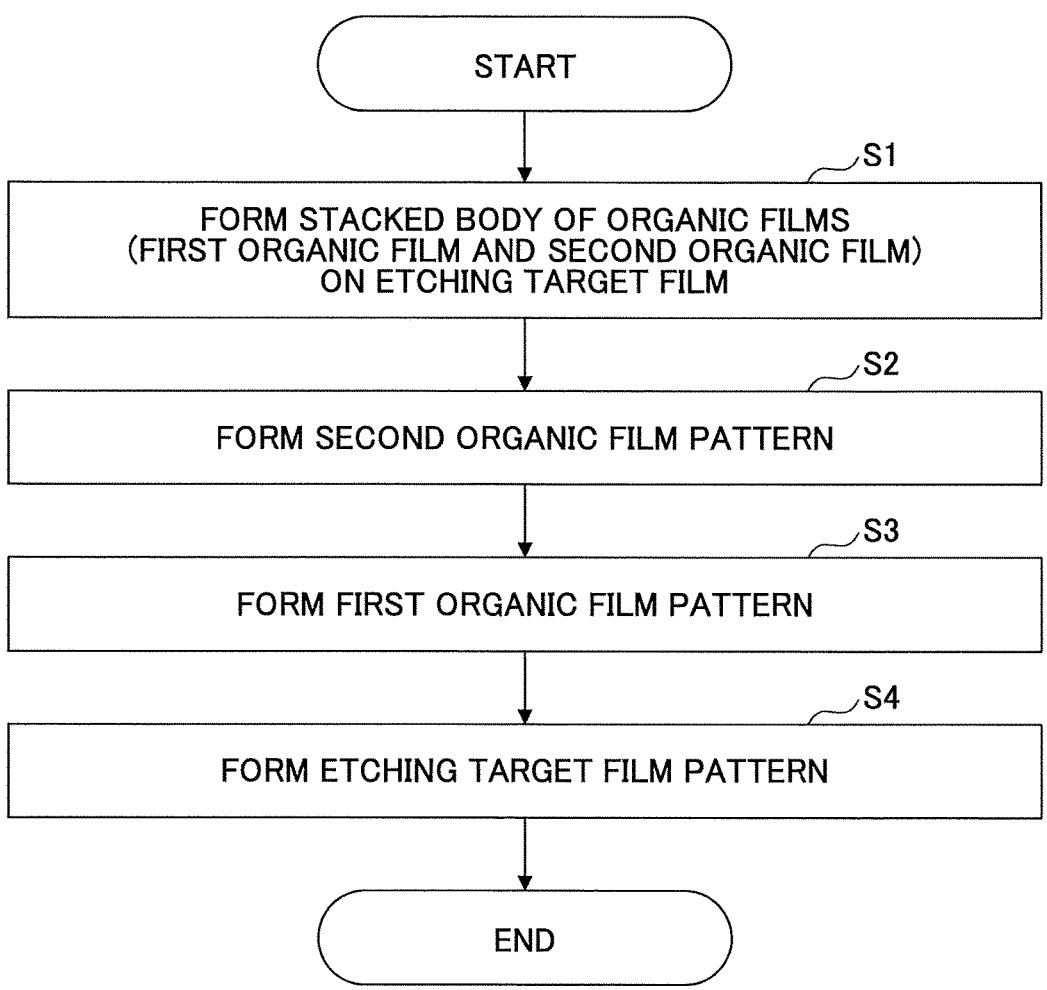
FIG. 1 is a flowchart illustrating an example of a pattern forming method according to an embodiment.

In the following, embodiments of the present invention will be described with reference to the accompanying drawings. In the specification and drawings, elements having substantially the same configurations are denoted by the same reference numerals and a duplicate description thereof will be omitted.

[Pattern Forming Method]

A pattern forming method according to an embodiment can employ what is known as self-aligned multiple patterning in which a given thin film is deposited over a line-and-space structure, and portions of the thin film deposited on each side (a sidewall) of each line are used.

First, referring to FIGS. 14A though 14F and FIGS. 15A through 15D, a conventional pattern forming method employing self-aligned multiple patterning will be described. The pattern forming method according to the present embodiment will be described later.

FIGS. 14A through 14F are cross-sectional views illustrating an example of the conventional pattern forming method. In the example of the conventional pattern forming method, as illustrated in FIG. 14A, a first organic film 92 is formed on an etching target film 91 by spin coating. Next, as illustrated in FIG. 14B, a silicon oxide film 93 is formed on the first organic film 92 by spin coating or chemical vapor deposition (CVD). Next, as illustrated in FIG. 14C, a second organic film 94 is formed on the silicon oxide film 93 by spin coating. Next, as illustrated in FIG. 14D, an antireflective film 95 and a resist pattern 96p having a line-and-space structure are formed on the second organic film 94. Next, as illustrated in FIG. 14E, the antireflective film 95 and the second organic film 94 are etched by using the resist pattern 96p as an etching mask such that the resist pattern 96p is transferred to the antireflective film 95 and the second organic film 94. As a result, an antireflective film pattern 95p and a second organic film pattern 94p are formed. Next, the antireflective film pattern 95p is removed by dilute hydrofluoric acid (dHF) such that the resist pattern 96p is removed along with the antireflective film pattern 95p. At this time, the dilute hydrofluoric acid partially dissolves the silicon oxide film 93 formed between the first organic film 92 and the second organic film pattern 94p, resulting in necking that causes the line width of the silicon oxide film 93 to become narrow. Such necking may pose a problem in that the second organic film pattern 94p easily comes off the first organic film 92.

FIGS. 15A through 15D are cross-sectional views illustrating another example of the conventional pattern forming method. In this example of the conventional pattern forming method, as illustrated in FIG. 15A, a first organic film 92 is formed on an etching target film 91 by spin coating. Next, a second organic film 94 is formed on the first organic film 92 by spin coating. At this time, an organic solvent used to form the second organic film 94 by the spin coating dissolves the first organic film 92. As a result, as illustrated in FIG. 15B, a mixed film 99 in which the first organic film 92 and the second organic film 94 are mixed is formed on the etching target film 91. Next, as illustrated in FIG. 15C, an antireflective film 95 and a resist pattern 96p having a line-and-space structure are formed on the mixed film 99. Next, the antireflective film 95 and the mixed film 99 are etched by using the resist pattern 96p as an etching mask such that the resist pattern 96p is transferred to the antireflective film 95 and the mixed film 99. As a result, an antireflective film pattern 95p and a mixed film pattern 99p are formed. In such a mixed film pattern 99p in which the first organic film 92 and the second organic film 94 are mixed, it is difficult to stop the etching at a desired depth, as illustrated in FIG. 15D.

Also, a method using an inorganic film in place of either the first organic film 92 or the second organic film 94 may be assumed. However, in the case of self-aligned multiple patterning in which a silicon oxide film is formed on an inorganic film and portions of the silicon oxide film deposited on both sides of the inorganic film are used as a sidewall, it is difficult to obtain a high etching selectivity between the inorganic film and the sidewall. Therefore, LER of the surface of the sidewall may increase.

In view of the above-described problem with the conventional technique, the present inventors have made earnest investigations, and have found a pattern forming method enabling self-aligned multiple patterning with reduced LER, which will be described below.

FIG. 1 is a flowchart illustrating an example of a pattern forming method according to an embodiment. As illustrated in FIG. 1, the pattern forming method includes a step S1 of forming a stacked body of organic films on an etching target film, a step S2 of forming a second organic film pattern, a step S3 of forming a first organic film pattern, and a step S4 of forming an etching target film pattern.

In the step S1 of forming the stacked body of the organic films on the etching target film, the first organic film and the second organic film are formed in this order on the etching target film formed on the surface of a semiconductor wafer (hereinafter referred to as a "wafer"). In the step S2 of forming the second organic film pattern, the second organic film pattern is formed by patterning the second organic film. In the step S3 of forming the first organic film pattern, the first organic film pattern having a pitch reduced to one-half of a pitch of the second organic film pattern is formed by patterning the first organic film by using a self-aligned patterning method that uses the second organic film pattern as a core pattern. In the step S4 of forming the etching target film pattern, the etching target film pattern having a pitch reduced to one-half of a pitch of the first organic film pattern is formed by patterning the etching target film by using a self-aligned patterning method that uses the first organic film pattern as a core pattern. In the following, the steps will be described in detail.

(Step S1 of Forming Stacked Body of Organic Films on Etching Target Film)

Figure 2A:
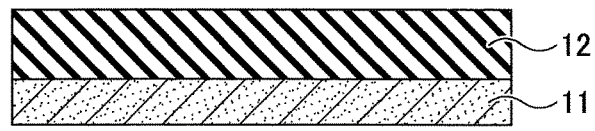
FIGS. 2A through 2C are schematic cross-sectional views illustrating an example of a process of forming a stacked body of organic films.
Figure 2B:
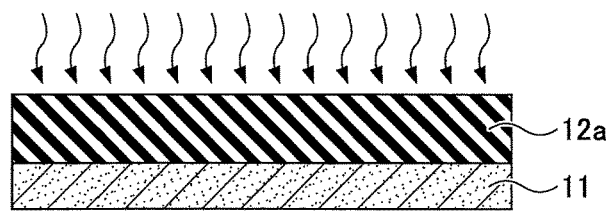
Figure 2C:
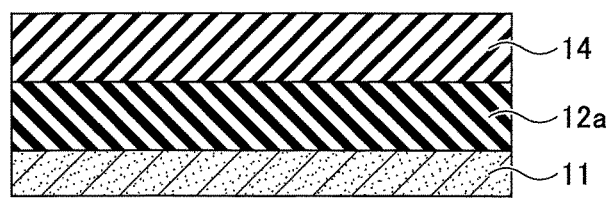

Referring to FIGS. 2A through 2C and FIG. 3, the step S1 of forming the stacked body of the organic films on the etching target film will be described. FIGS. 2A through 2C are schematic cross-sectional views illustrating an example of a process of forming the stacked body of the organic films. FIG. 3 is a flowchart illustrating an example of a process of infiltrating a silicon-containing gas into the first organic film.

First, an etching target film 11 formed on a wafer (not illustrated) is coated with a composition including a polymer including a cross-linkable component. As a result, a first organic film 12 is formed on the etching target film 11 as illustrated in FIG. 2A.

In the present embodiment, the etching target film 11 is a silicon film. The composition includes a polymer (component A) obtained by polymerizing a monomer having a hydroxy group, cross-linking agent (component B), an acid or an acid generator (component C), and a solvent (component D).

Examples of the monomer having a hydroxy group include a monomer having a phenolic hydroxy group and a monomer having an alcoholic hydroxy group. Examples of the polymer obtained by polymerizing the monomer having a hydroxy group include a compound having units represented by the following chemical formulas (1) and (2).

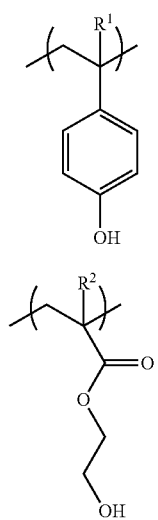

In the chemical formulas (1) and (2), $R^1$ and $R^2$ each represent a hydrogen atom, a halogen atom, or an alkyl group which has 1 to 5 carbon atoms and may have a substituent.

The polymer obtained by polymerizing the monomer having a hydroxy group may be a copolymer obtained by polymerizing the monomer having a hydroxy group and any monomer not having a hydroxy group. Examples of the monomer not having a hydroxy group include styrene and a derivative thereof. Examples of the copolymer of the monomer having a hydroxy group and the monomer not having a hydroxy group include a copolymer of polyhydroxy styrene (PHS) and polystyrene (PS) (for example, a mass-average molecular weight (Mw)=3,000 and a weight ratio of PHS/PS=68/32).

The cross-linking agent may be a compound that is capable of crosslinking a polymer having a hydroxy group in the presence of an acid. Examples of the cross-linking agent include a methylol group-containing compound, an alkoxyalkyl group-containing compound, a carboxymethyl group-containing compound, and an epoxy compound.

Examples of the acid include an organic sulfonic acid and an organic carboxylic acid. Examples of the acid generator include a thermal acid generator and a photoacid generator. Examples of the thermal acid generator include an amine salt of the organic sulfonic acid, an amine salt of the organic carboxylic acid, and a sulfonium salt. Examples of the photoacid generator include a sulfonium salt and an iodonium salt.

The solvent may be any component that forms a homogeneous solution by dissolving the components to be used. Examples of the organic solvent include: lactones such as γ-butyrolactone; ketones such as acetone, methyl ethyl ketone (MEK), cyclohexanone, methyl n-pentyl ketone (2-Heptanone), and methyl isopentyl ketone; polyhydric alcohols such as ethylene glycol, diethylene glycol, propylene glycol, and dipropylene glycol; derivatives of polyhydric alcohols such as a compound having an ester bond (such as ethylene glycol monoacetate, diethylene glycol monoacetate, propylene glycol monoacetate, or dipropylene glycolmonoacetate), and a compound having an ether bond such as monoalkyl ether (e.g., monomethyl ether, monoethyl ether, monopropyl ether and monobutyl ether) or monophenyl ether of polyhydric alcohols or a compound having an ester bond (among them, propylene glycol monomethyl ether acetate (PGMEA) and propylene glycol monomethyl ether (PGME) are preferable); cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, and mesitylene; and dimethyl sulfoxide (DMSO). These organic solvents may be used alone or may be combined as a mixed solvent. Among them, PGMEA and PGME are preferable.

Next, an inorganic substance is infiltrated into the first organic film 12 (an infiltration process). Examples of the inorganic substance include silicon and metal. In the present embodiment, as illustrated in FIG. 3, the infiltration process includes a step S11 of exposing the first organic film 12 to a silicon-containing gas, a step S12 of purging with nitrogen ($N_2$), a step S13 of exposing the first organic film 12 to water vapor, and a step S14 of purging with $N_2$. The infiltration process also includes a step S15 of determining whether steps S11 through S14 are repeated at a predetermined number of times. By performing these steps, the silicon can be infiltrated into the first organic film 12. Accordingly, etching resistance to oxygen plasma (hereinafter referred to as "oxygen plasma resistance") can be provided to the first organic film 12. Further, the silicon may be infiltrated into the entire first organic film 12 in the thickness direction or may be infiltrated into only the surface of the first organic film 12, such that the silicon is infiltrated into the first organic film 12. Moreover, when the silicon is infiltrated into the entire first organic film 12 in the thickness direction, density distribution in which the density increases toward a second organic film side from the etching target film 11 side is preferably formed.

In the infiltration process, the amount of silicon infiltrated into the first organic film 12 may be adjusted by changing wafer temperature, pressure, an exposure time, and the number of times steps S11 through S14 are repeated (the number of repetitions). Specifically, the amount of silicon infiltrated into the first organic film 12 may increase by raising the wafer temperature, and the amount of silicon infiltrated into the first organic film 12 may decrease by lowering the wafer temperature. Also, the amount of silicon infiltrated into the first organic film 12 may increase by increasing the number of repetitions, and the amount of silicon infiltrated into the first organic film may decrease by decreasing the number of repetitions.

Examples of the silicon-containing gas include hexamethyldisilazane (HMDS), N-(trimethylsilyl)dimethylamine (TMSDMA), trimethylsilylimidazole (TMSI), N,O-bis(trimethylsilyl)trifluoroacetamide (BSTFA), N,O-bis(trimethylsilyl)acetamide (BSA), N-methyl-N-trimethylsilyltrifluoroacetamide (MSTFA), N-(trimethylsilyl)diethylamine (TMSDEA), N-methyl-N-trimethylsilylacetamide (MTMSA), and trimethylchlorosilane (TMCS).

Further, the infiltration process may be performed under vacuum or may be performed at atmospheric pressure. Also, the present embodiment has described the example in which the step S11 of exposing the first organic film 12 to the silicon-containing gas and the step S13 of exposing the first organic film 12 to water vapor are repeatedly performed. However, the step S13 of exposing the first organic film 12 to water vapor may be omitted. In order to facilitate infiltration, the step S13 of exposing the first organic film 12 to water vapor is preferably performed.

Further, when metal is infiltrated into the first organic film 12 in place of silicon, the first organic film 12 may be exposed to a metal-containing gas, instead of performing the step S11 of exposing the first organic film 12 to the silicon-containing gas. Examples of the metal infiltrated into the first organic film 12 include aluminum, titanium, and zirconium. As an aluminum-containing gas used to infiltrate aluminum, trimethylaluminum (TMA) may be used, for example. Similarly, a titanium-containing gas is used to infiltrate titanium and a zirconium-containing gas is used to infiltrate zirconium.

Further, in order to stabilize the first organic film 12 with completion of the infiltration reaction, an annealing process of annealing the first organic film is preferably performed after the infiltration process is performed. Examples of annealing include plasma processing, heat processing, vacuum ultraviolet (VUV) irradiation, ozone processing, and electron beam (EB) irradiation.

After the inorganic substance is infiltrated into the first organic film 12, the polymer included in the first organic film 12 is cross-linked (a cross-linking process). Specifically, when the composition includes the acid or the thermal acid generator, the first organic film 12 is heated to a predetermined temperature (for example, 100° C. to 150° C.) so as to cause the polymer to react with the cross-linking agent and to be cross-linked. When the composition includes the photoacid generator, by irradiating the first organic film 12 with predetermined light so as to generate an acid and heating the first organic film 12 to the predetermined temperature, the polymer reacts with the cross-linking agent and is cross-linked. Accordingly, etching resistance to the organic solvent (hereinafter referred to as "organic solvent resistance") can be provided to the first organic film 12.

In this way, by infiltrating the silicon into the first organic film 12 and causing the first organic film 12 to be subjected to cross-linking, a first organic film 12a having oxygen plasma resistance and organic solvent resistance can be formed as illustrated in FIG. 2B.

Although the present embodiment has described the example in which the cross-linking process is performed after the infiltration process, the present invention is not limited thereto. The infiltration process may be performed after the cross-linking process. Further, the infiltration process and the cross-linking process may be performed at the same time. However, in order to make it easy to control the amount of the inorganic substance infiltrated into the first organic film 12, the infiltration process is preferably performed before the cross-linking process.

Next, the first organic film 12a is coated with an organic compound. As a result, a second organic film 14 is formed on the first organic film 12a as illustrated in FIG. 2C. At this time, the first organic film 12a has organic solvent resistance. Thus, the first organic film 12 and the second organic film 14 can be prevented from being mixed. Also, the organic compound may be the composition used to form the first organic film 12a or may be another composition.

(Step S2 of Forming Second Organic Film Pattern)

Figure 4A:
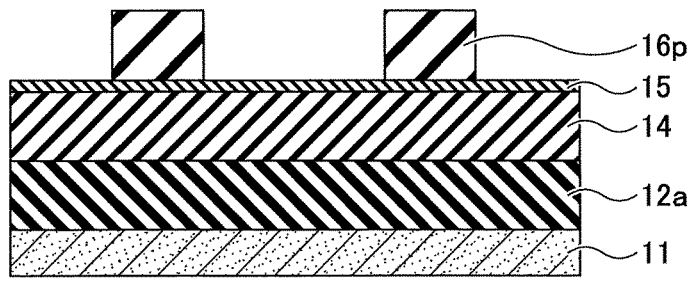
FIGS. 4A through 4C are schematic cross-sectional views illustrating an example of a process of forming a second organic film pattern.
Figure 4B:
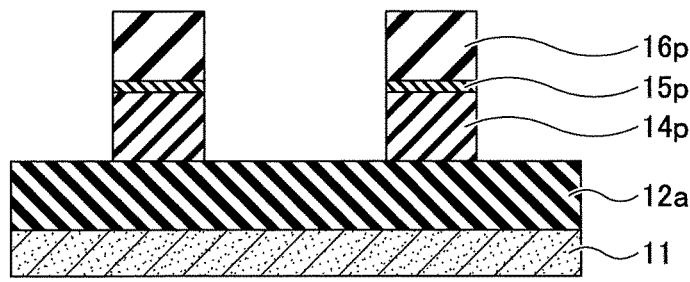
Figure 4C:
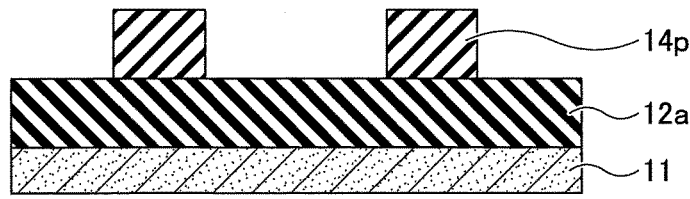

Referring to FIGS. 4A through 4C, the step S2 of forming the second organic film pattern will be described. FIGS. 4A through 4C are schematic cross-sectional views illustrating an example of a process of forming the second organic film pattern.

First, an antireflective film 15 and a resist film 16 are formed on the second organic film 14 in this order. Next, a resist pattern 16p is formed by patterning the resist film 16 by using a photolithography technique. As a result, as illustrated in FIG. 4A, the resist pattern 16p is formed above the second organic film 14. As the antireflective film 15, a silicon oxide film formed by spin coating and a silicon oxide film and an amorphous silicon film deposited by CVD may be used. Further, titanium (Ti), titanium oxide (TiO$_2$), and titanium nitride (TiN) deposited by vacuum deposition, CVD, or sputtering may also be used. The exposure according to the photolithography technique may be performed by using a KrF excimer laser, an ArF excimer laser, an F$_2$ excimer laser, extreme ultraviolet (EUV) rays, vacuum ultraviolet (VUV) rays, electron beams (EBs), X rays, or other radiation. Further, as a method of exposing the resist film 16 to light, a dry exposure method performed in air or in an inert gas such as nitrogen may be employed or immersion lithography may be employed. In the immersion lithography, the exposure is performed in a state in which a space between the resist film 16 and an exposure apparatus is filled with a solvent having a refractive index larger than the refractive index of air. In the present embodiment, the resist pattern 16p has a line-and-space structure. Further, after the resist pattern 16p is formed by using the photolithography technique, a slimming process for thinning the line width of the resist pattern 16p may be performed.

Next, the antireflective film 15 is etched by using the resist pattern 16p as an etching mask. As a result, the resist pattern 16p is transferred to the antireflective film 15, and an antireflective film pattern 15p is formed. Next, the second organic film 14 is etched by oxygen plasma by using the resist pattern 16p as an etching mask. As a result, the resist pattern 16p is transferred to the second organic film 14, and a second organic film pattern 14p is formed. The first organic film 12a has oxygen plasma resistance. Thus, the first organic film 12a can be prevented from being etched by the oxygen plasma. Namely, the first organic film 12a functions as an etching stop layer when the second organic film 14 is etched.

Next, the antireflective film pattern 15p is removed by wet etching using dilute hydrofluoric acid, such that the resist pattern 16p is removed along with the antireflective film pattern 15p. Because the first organic film 12a is formed of the organic compound, the first organic film 12a has etching resistance to the dilute hydrofluoric acid (hereinafter referred to as "dilute hydrofluoric acid resistance"). Accordingly, as illustrated in FIG. 4C, it is possible to selectively remove the antireflective film pattern 15p and the resist pattern 16p without etching the first organic film 12a. In the present embodiment, the resist pattern 16p is transferred to the second organic film pattern 14p. Thus, the second organic film pattern 14p has a line-and-space structure having the same pitch as that of the resist pattern 16p.

(Step S3 of Forming First Organic Film Pattern)

The step S3 of forming the first organic film pattern will be described. FIGS. 5A through 5E are schematic cross-sectional views illustrating an example of a process of forming the first organic film pattern.

First, a silicon oxide film 17 is formed to cover the second organic film pattern 14p by atomic layer deposition (ALD) or molecular layer deposition (MLD). As illustrated in FIG. 5A, the conformal silicon oxide film 17 is formed in such a manner that a thickness of the silicon oxide film 17 deposited on an upper surface of the second organic film pattern 14p is nearly equal to a thickness of the silicon oxide film 17 deposited on sides of the second organic film pattern 14p.

Next, the silicon oxide film 17 is etched back by anisotropic etching until the upper surface of the second organic film pattern 14p is exposed. As a result, the silicon oxide film 17 remains on each side of the second organic film pattern 14p, and a first sidewall 17p is formed as illustrated in FIG. 5B.

Next, the second organic film pattern 14p is removed by oxygen plasma. As a result, the first sidewall 17p remains. The etching rate ratio (an etching selectivity) of the second organic film pattern 14p to the first sidewall 17p in oxygen plasma is high. Therefore, as illustrated in FIG. 5C, the first sidewall 17p is prevented from being etched. Accordingly, LER of the surface of the first sidewall 17p can be reduced. In the present embodiment, the first sidewall 17p has a line-and-space structure having a pitch reduced to one-half of a pitch of the second organic film pattern 14p.

Next, the first organic film 12a is etched by hydrogen ($H_2$)/nitrogen ($N_2$) plasma by using the first sidewall 17p as an etching mask. As a result, as illustrated in FIG. 5D, a pattern of the first sidewall 17p is transferred to the first organic film 12a, and a first organic film pattern 12p is formed. Because the etching selectivity of the first organic film 12a to the first sidewall 17p in $H_2/N_2$ plasma is high, the first sidewall 17p is hardly etched. Therefore, the pattern of the first sidewall 17p can be transferred to the first organic film 12a with high accuracy.

Next, the first sidewall 17p is removed by wet etching using the dilute hydrofluoric acid. Because the first organic film pattern 12p is formed of the organic compound, the first organic film pattern 12p has dilute hydrofluoric acid resistance. Therefore, when the first sidewall 17p is removed by the wet etching using the dilute hydrofluoric acid, it is possible to selectively remove the first sidewall 17p without etching the first organic film pattern 12p. In the present embodiment, the pattern of the first sidewall 17p is transferred to the first organic film pattern 12p. Thus, the first organic film pattern 12p has a line-and-space structure having a pitch reduced to one-half of the pitch of the second organic film pattern 14p.

(Step S4 of Forming Etching Target Film Pattern)

The step S4 of forming the etching target film pattern will be described. FIGS. 6A through 6E are schematic cross-sectional views illustrating an example of a process of forming the etching target film pattern.

First, a silicon oxide film 18 is formed to cover the first organic film pattern 12p by ALD or MLD. As illustrated in FIG. 6A, the conformal silicon oxide film 18 is formed in such a manner that a thickness of the silicon oxide film 18 deposited on an upper surface of the first organic film pattern 12p is nearly equal to a thickness of the silicon oxide film 18 deposited on sides of the first organic film pattern 12p.

Next, the silicon oxide film 18 is etched back by anisotropic etching until the upper surface of the first organic film pattern 12p is exposed. As a result, the silicon oxide film 18 remains on each side of the first organic film pattern 12p, and a second sidewall 18p is formed as illustrated in FIG. 6B.

Next, the first organic film pattern 12p is removed by $H_2/N_2$ plasma. As a result, the second sidewall 18p remains. The etching selectivity of the first organic film pattern 12p to the second sidewall 18p in $H_2/N_2$ plasma is high. Therefore, as illustrated in FIG. 6C, the second sidewall 18p is prevented from being etched. Accordingly, LER of the surface of the second sidewall 18p can be reduced. In the present embodiment, the second sidewall 18p has a line-and-space structure having a pitch reduced to one-half of the pitch of the first organic film pattern 12p. Namely, the second sidewall 18p has the line-and-space structure having the pitch reduced to one fourth of the pitch of the second organic film pattern 14p.

Next, the etching target film 11 is etched by using the second sidewall 18p as an etching mask. As a result, as illustrated in FIG. 6D, a pattern of the second sidewall 18p is transferred to the etching target film 11, and an etching target film pattern 11p is formed.

Next, the second sidewall 18p is removed by wet etching using the dilute hydrofluoric acid as illustrated in FIG. 6E. In the present embodiment, the pattern of the second sidewall 18p is transferred to the etching target film pattern 11p. Thus, the etching target film pattern 11p has a line-and-space structure having a pitch reduced to one-half of the pitch of the first organic film pattern 12p. Namely, the etching target film pattern 11p has the line-and-space structure having the pitch reduced to one-fourth of the pitch of the second organic film pattern 14p.

As described above, in the pattern forming method according to the present embodiment, a line width smaller than the exposure critical dimension of the photolithography technique can be provided. Further, by employing the self-aligned patterning method using the stacked body of the organic films formed on the etching target film 11, self-aligned multiple patterning with reduced LER can be provided.

EXAMPLES

Next, in the following, examples performed to investigate an effect of the pattern forming method according to the present embodiment will be described.

Example 1

In Example 1, a sample was prepared by forming a first organic film on an etching target film, infiltrating silicon into the first organic film, and causing the first organic film to be subjected to cross-linking under the following conditions. For this sample, oxygen plasma resistance and dilute hydrofluoric acid resistance were evaluated.

(Conditions for Forming First Organic Film)

The first organic film was formed by coating the etching target film with a composition indicated in Table 1 below by spin coating.

TABLE 1

| Component A | Component B | Component C | Component D |
|---|---|---|---|
| 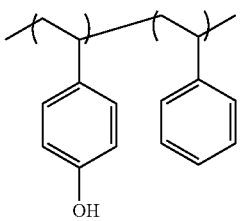<br>Mw = 3000,<br>PHS/PS = 68/32<br>100 parts by weight | 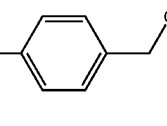<br>13.02 parts by weight | 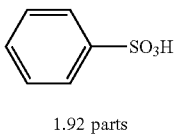<br>1.92 parts by weight | PGMEA/PGME = 6/4<br>7,000 parts by weight |

(Infiltration Condition) By performing the step S11 of exposing the first organic film to a silicon-containing gas, the step S12 of purging with $N_2$, the step S13 of exposing the first organic film to water vapor, and the step S14 of purging with $N_2$ at a predetermined number of times, 0 to 30 atom % of silicon was infiltrated into the first organic film. A mixed solution of N-(trimethylsilyl)dimethylamine and butyl acetate was vaporized and used as the silicon-containing gas.

(Cross-Linking Condition)

By heating the first organic film to a predetermined temperature, a copolymer of PHS and PS included in the first organic film was cross-linked.

Figure 7:
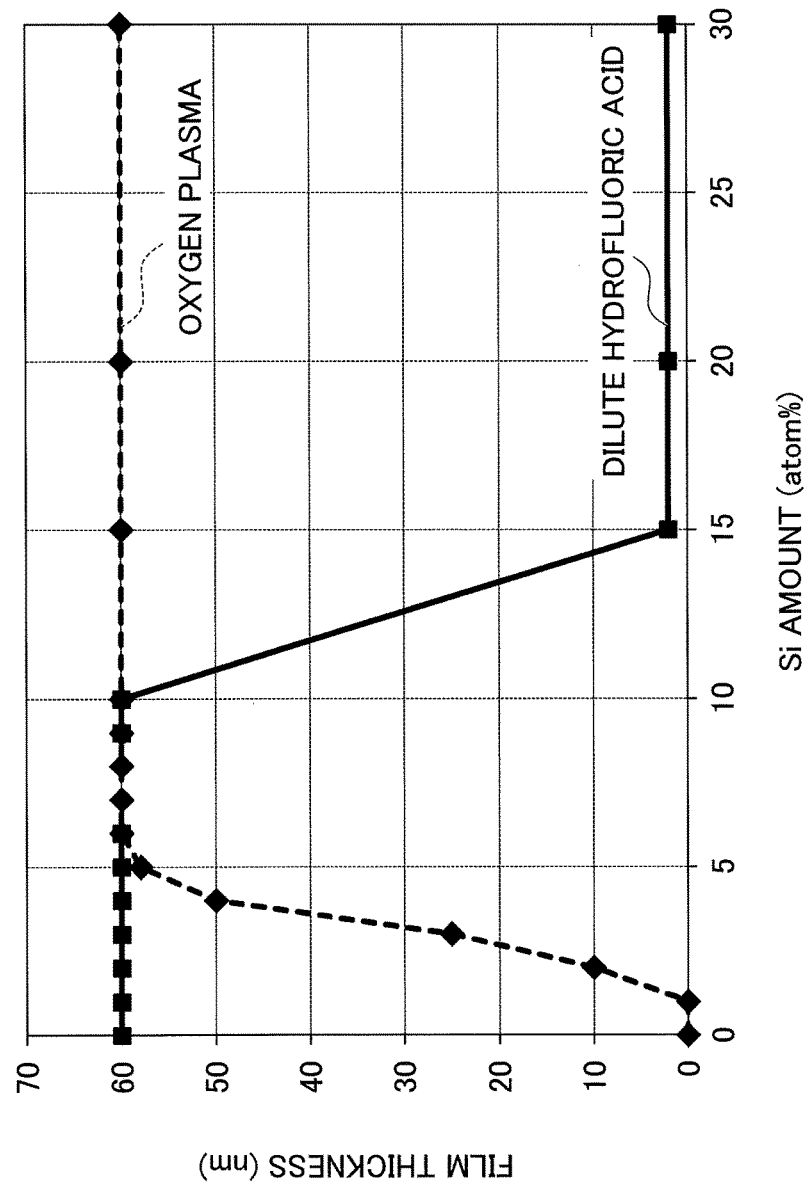
FIG. 7 is a graph showing oxygen plasma resistance and dilute hydrofluoric acid resistance for a first organic film.

FIG. 7 is a graph showing oxygen plasma resistance and dilute hydrofluoric acid resistance for the first organic film. In FIG. 7, the horizontal axis indicates a content (atom %) of silicon infiltrated into the first organic film, and the vertical axis indicates a thickness (nm) of the first organic film. Also, in FIG. 7, a line with diamond shapes indicates a thickness of the first organic film after being etched by oxygen plasma, and a line with squares indicates a thickness of the first organic film after being etched by dilute hydrofluoric acid.

As shown in FIG. 7, it is found that when the content of silicon infiltrated into the first organic film is greater than or equal to 6 atom %, the first organic film is not etched by the oxygen plasma. It is also found that when the content of silicon infiltrated into the first organic film is 5 atom %, the first organic film is hardly etched by the oxygen plasma. Conversely, it is found that when the content of silicon infiltrated into the first organic film is less than or equal to 1 atom %, the first organic film is completely etched by the oxygen plasma. Accordingly, in order to provide oxygen plasma resistance to the first organic film, the content of silicon infiltrated into the first organic film is preferably greater than or equal to 2 atom %, more preferably greater than or equal to 5 atom %, and even more preferably greater than or equal to 6 atom %.

Further, as shown in FIG. 7, it is found that when the content of silicon infiltrated into the first organic film is less than or equal to 10 atom %, the first organic film is not etched by the dilute hydrofluoric acid. Conversely, it is found that when the content of silicon infiltrated into the first organic film is greater than or equal to 15 atom %, the first organic film is mostly etched by the dilute hydrofluoric acid. Accordingly, in order to allow the first organic film to maintain dilute hydrofluoric acid resistance, the content of silicon infiltrated into the first organic film is preferably less than 15 atom % and more preferably less than 10 atom %.

Example 2

In Example 2, a sample was prepared by forming a first organic film by coating an etching target film with a composition containing PHS by spin coating and infiltrating 8 atom % of silicon into the first organic film. Also, another sample was prepared in the same way, except that no silicon was filtrated into the first organic film. For these samples, oxygen plasma resistance was evaluated and compared. Further, the same infiltration condition was used as that of Example 1.

Figure 8:
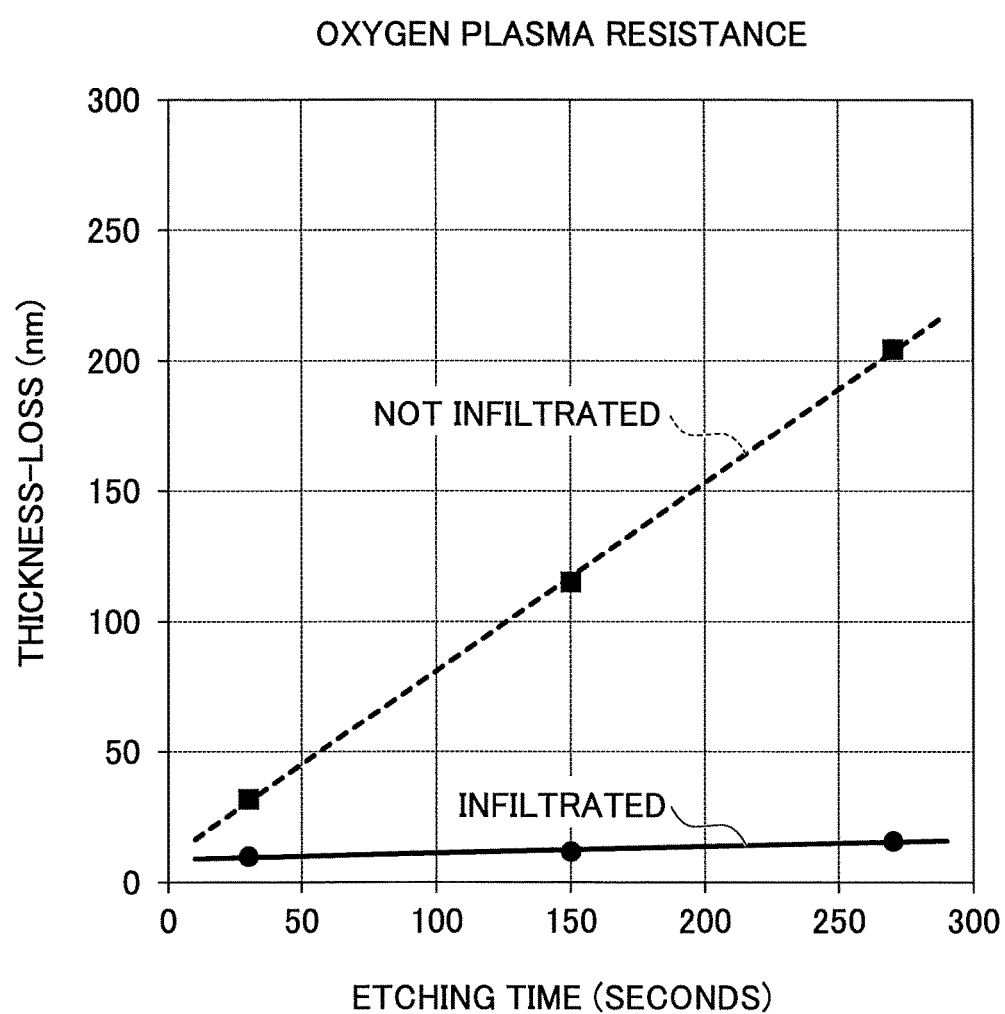
FIG. 8 is a graph showing oxygen plasma resistance in respective cases where silicon is infiltrated and is not infiltrated into a first organic film.

FIG. 8 is a graph showing oxygen plasma resistance in respective cases where silicon is infiltrated and is not infiltrated into the first organic film. In FIG. 8, the horizontal axis indicates an etching time (seconds) and the vertical axis indicates a film thickness (nm). Also, in FIG. 8, a line with circles indicates a result obtained from the sample with 8 atom % of silicon infiltrated, and a line with squares indicates a result obtained from the sample without silicon infiltrated.

As shown in FIG. 8, it is found that the first organic film is etched in proportion to the etching time for the sample without silicon infiltrated, while the first organic film is hardly etched regardless of the elapsed etching time for the sample with silicon infiltrated. Namely, it is found that oxygen plasma resistance is provided to the first organic film by infiltrating silicon into the first organic film.

Example 3

In Example 3, a sample was prepared by forming a first organic film by coating an etching target film with a composition containing PHS by spin coating and infiltrating 8 atom % of silicon into the first organic film. Also, another sample was prepared in the same way, except that no silicon was filtrated into the first organic film. For these samples, dilute hydrofluoric acid resistance was evaluated and compared. Further, the same infiltration condition was used as that of Example 1.

Figure 9:
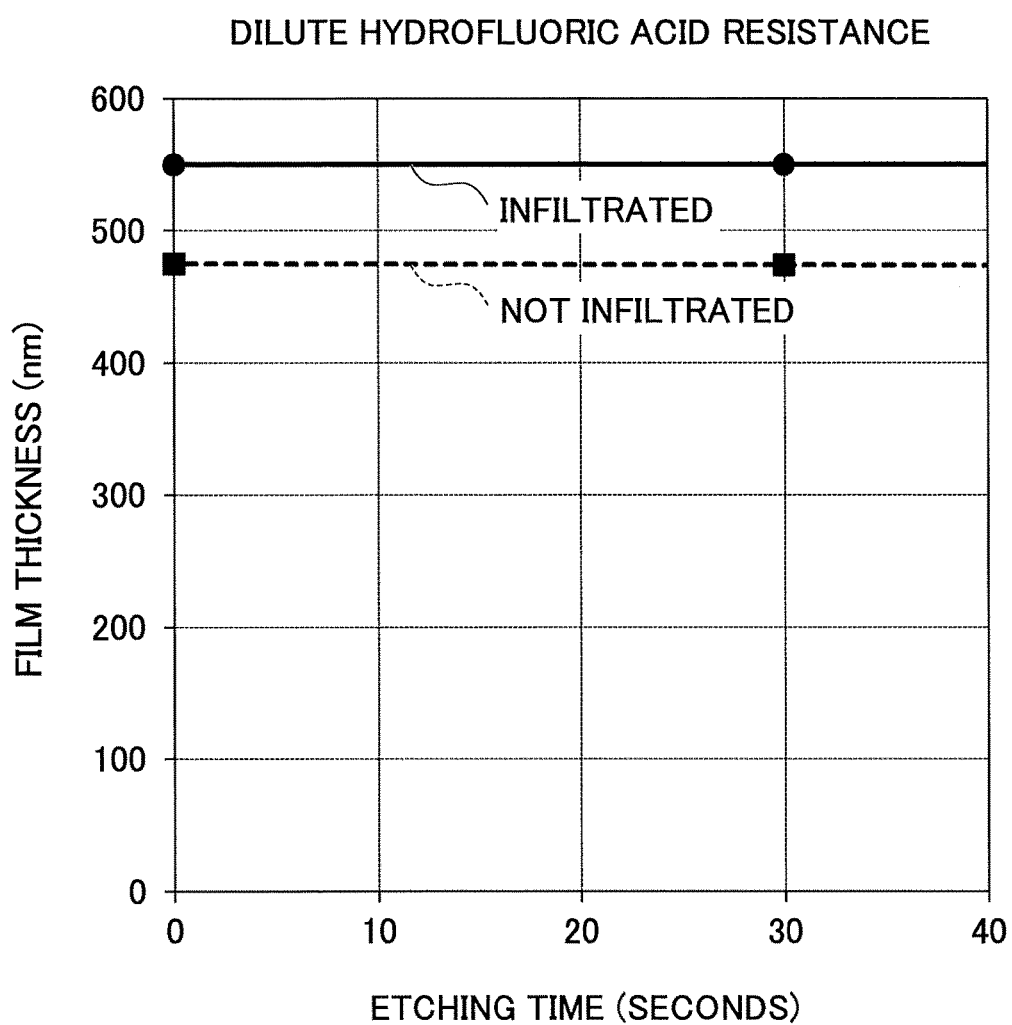
FIG. 9 is a graph showing dilute hydrofluoric acid resistance in respective cases where silicon is infiltrated and is not infiltrated into a first organic film.

FIG. 9 is a graph showing dilute hydrofluoric acid resistance in respective cases where silicon is infiltrated and is not infiltrated into the first organic film. In FIG. 9, the horizontal axis indicates an etching time (seconds) and the vertical axis indicates a film thickness (nm). Also, in FIG. 9, a line with circles indicates a result obtained from the sample with 8 atom % of silicon being infiltrated, and a line with squares indicates a result obtained from the sample without silicon infiltrated.

As shown in FIG. 9, it is found that the sample with 8 atom % of silicon being infiltrated is not etched by the dilute hydrofluoric acid, similarly to the sample without silicon infiltrated. Namely, it is found that the sample with 8 atom % of silicon being infiltrated maintains dilute hydrofluoric acid resistance at the substantially same level as the sample without silicon infiltrated.

Example 4

In Example 4, a sample was prepared by forming a first organic film by coating an etching target film with the composition used in Example 1 by spin coating, infiltrating 8 atom % of silicon into the first organic film, and causing the first organic film to be subjected to cross-linking under the same conditions as Example 1. For this sample, organic solvent resistance was evaluated by forming a second organic film on the first organic film.

Figure 10A:
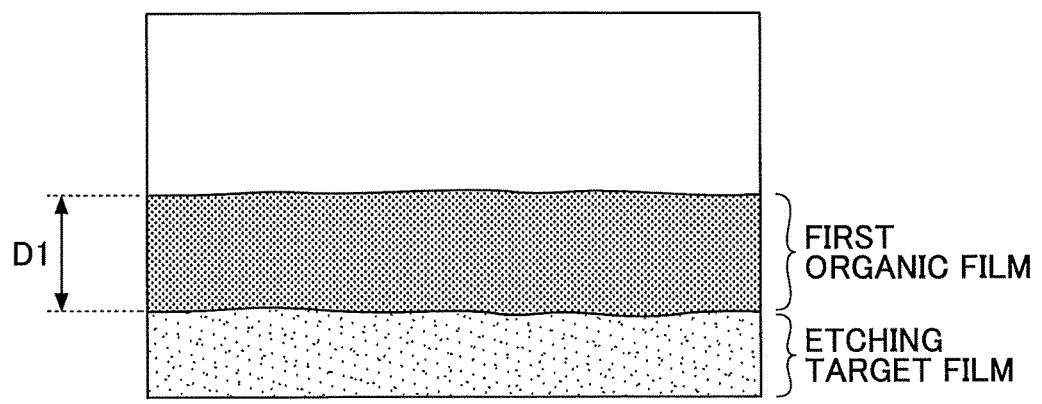
FIGS. 10A and 10B are schematic cross-sectional views illustrating an example in which a second organic film is formed on a first organic film.
Figure 10B:
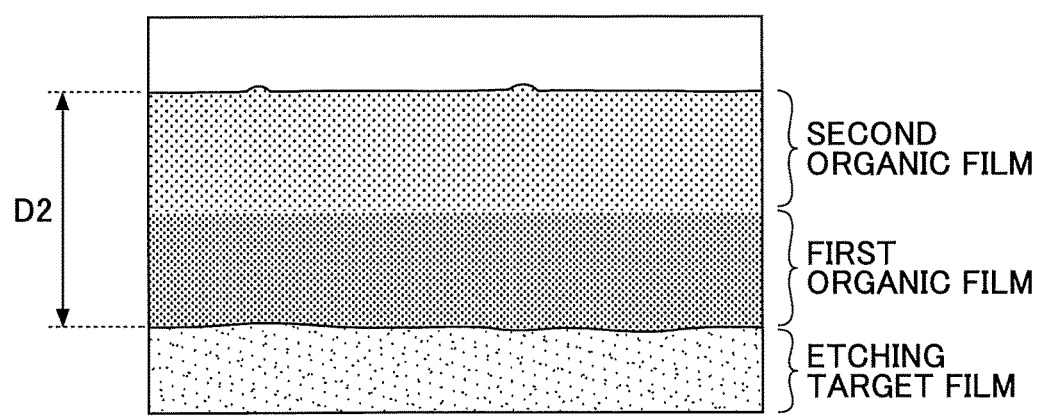

FIGS. 10A and 10B are schematic cross-sectional views illustrating an example in which the second organic film is formed on the first organic film. FIG. 10A is a cross section when the first organic film is formed on the etching target film and is subjected to silicon infiltration and cross-linking. FIG. 10B is a cross section when the second organic film is formed after the first organic film is formed on the etching target film and is subjected to silicon infiltration and cross-linking.

As illustrated in FIGS. 10A and 10B, when the second organic film was formed on the first organic film after the first organic film was subjected to silicon infiltration and cross-linking, the second organic film was not mixed into the first organic film. A total thickness D2 of the first organic film and the second organic film was approximately twice a thickness D1 of the first organic film. Accordingly, it has been verified that, by infiltrating silicon into the first organic film and causing the first organic film to be subjected to cross-linking, organic solvent resistance is provided to the first organic film.

Example 5

In Example 5, a sample was prepared by forming a first organic film by coating an etching target film with the composition used in Example 1 by spin coating, infiltrating 8 atom % of silicon into the first organic film, and causing the first organic film to be subjected to cross-linking under the same conditions as Example 1. For this sample, oxygen plasma resistance was evaluated.

Figure 11A:
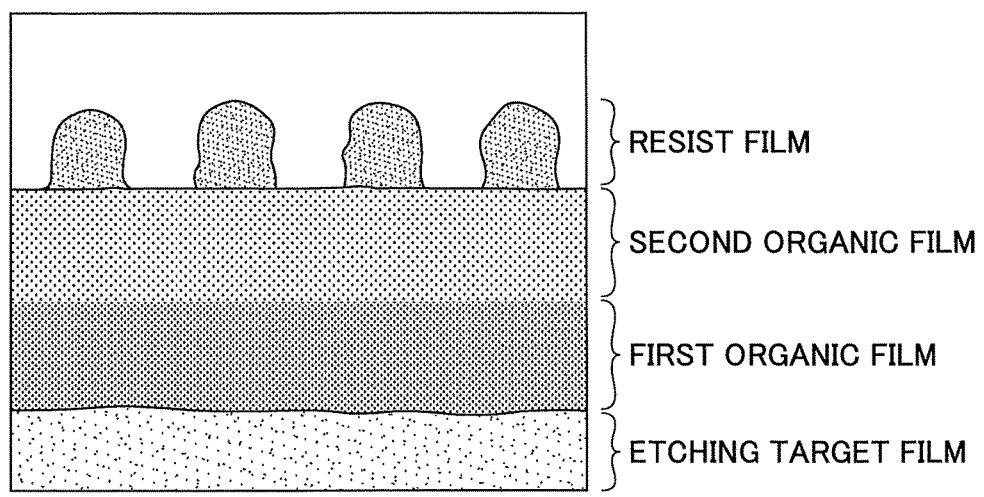
FIGS. 11A and 11B are schematic cross-sectional views illustrating a result indicating that a first organic film has oxygen plasma resistance.
Figure 11B:
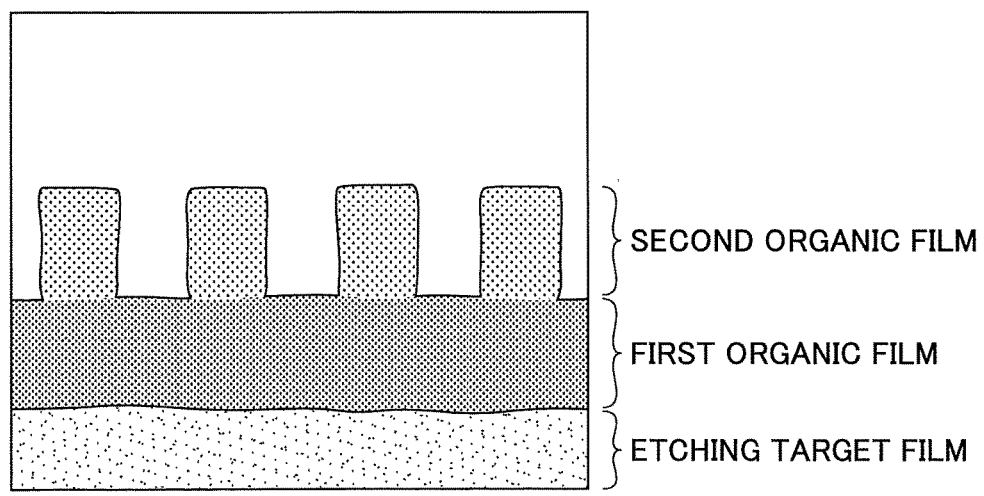

FIGS. 11A and 11B are schematic cross-sectional views illustrating a result indicating that the first organic film has oxygen plasma resistance: FIG. 11A illustrates a cross section before the second organic film is etched by using a resist pattern as an etching mask. FIG. 11B illustrates a cross section after the second organic film is etched by oxygen plasma by using the resist pattern as the etching mask and the resist pattern is removed.

As illustrated in FIG. 11B, after the second organic film was etched by the oxygen plasma by using the resist pattern as the etching mask, the first organic film remained. Accordingly, it has been verified that, by infiltrating silicon into the first organic film and causing the first organic film to be subjected to cross-linking, organic solvent resistance is provided to the first organic film. Namely, it has been verified that the first organic film functions as an etching stop layer for oxygen plasma.

Example 6

In Example 6, a sample was prepared by forming a first organic film by coating an etching target film with the composition used in Example 1 by spin coating, infiltrating 8 atom % of silicon into the first organic film, and causing the first organic film to be subjected to cross-linking under the same conditions as Example 1. For this sample, dilute hydrofluoric acid resistance was evaluated.

Figure 12:
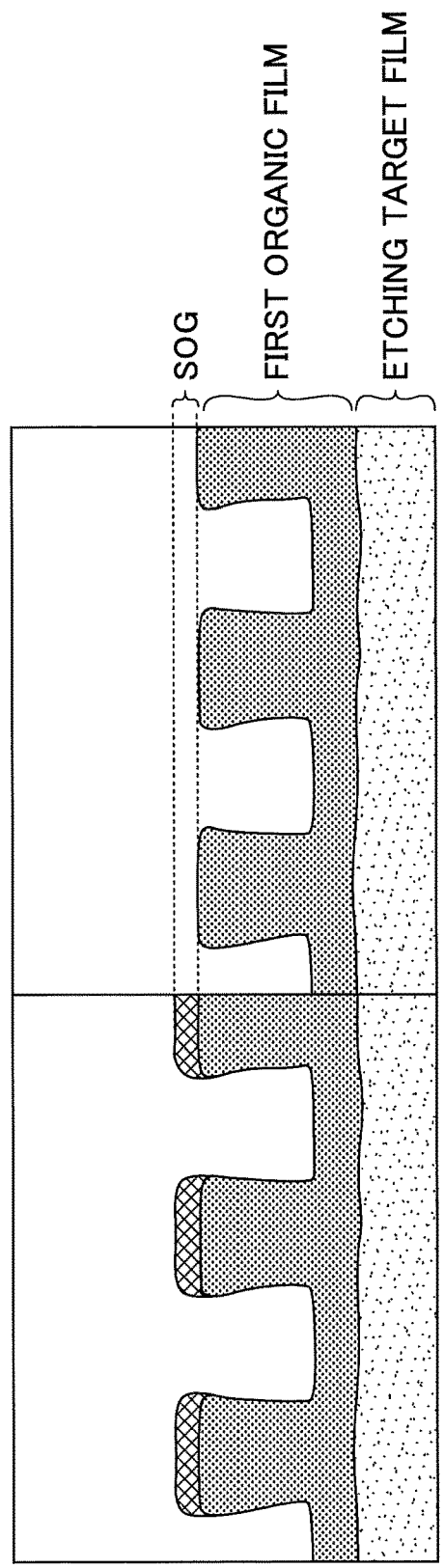
FIG. 12 is a schematic cross-sectional view illustrating a result indicating that a first organic film has dilute hydrofluoric acid resistance.

FIG. 12 is a schematic cross-sectional view illustrating a result indicating that a first organic film has dilute hydrofluoric acid resistance.

Left and right sides of FIG. 12 illustrate respective cross sections before and after a silicon oxide film (hereinafter referred to as a "SOG film") formed on the second organic film by spin coating is removed by dilute hydrofluoric acid.

As illustrated in the left and right sides of FIG. 12, a change in the shape of the first organic film was not observed before and after the SOG film formed on the first organic film was removed by wet etching using the dilute hydrofluoric acid. Accordingly, it has been verified that, by infiltrating silicon into the first organic film and performing cross-linking, dilute hydrofluoric acid resistance is provided to the first organic film.

Example 7

In Example 7, a pattern having a line-and-space structure was formed by using the pattern forming method according to the above-described embodiment, and characteristics of the pattern were evaluated. Also, in Example 7, a first organic film was formed by coating an etching target film with the composition used in Example 1 by spin coating, 8 atom % of silicon was infiltrated into the first organic film, and the first organic film was subjected to cross-linking under the same conditions as Example 1.

FIGS. 13A through 13F are diagrams illustrating the pattern having the line-and-space structure formed by using the pattern forming method according to the embodiment. Lower sides of FIGS. 13A through 13F illustrate SEM images corresponding to upper surfaces of cross-sectional views illustrated on upper sides of FIGS. 13A through 13F.

As illustrated in FIG. 13A, when the resist pattern having the line-and-space structure is formed, a line width (critical dimension: CD) of the resist pattern was 67.3 nm and LER was 5.2 nm.

As illustrated in FIG. 13B, when a second organic film pattern was formed by transferring the resist pattern to a second organic film, a CD of the second organic film pattern was 63.2 nm and LER was 2.8 nm.

As illustrated in FIG. 13C, when a silicon oxide film was formed to cover the second organic film pattern, a CD of a pattern of the silicon oxide film was 117.7 nm and LER was 2.7 nm.

As illustrated in FIG. 13D, when a first organic film pattern was formed by transferring, to the first organic film, a pattern of a first sidewall formed by the silicon oxide film, a CD of the first organic film pattern was 31.8 nm and LER was 2.6 nm.

As illustrated in FIG. 13E, when a silicon oxide film is formed to cover the first organic film pattern, a CD of a pattern of the silicon oxide film was 55.0 nm and LER was 2.7 nm.

As illustrated in FIG. 13F, when an etching target film pattern was formed by transferring, to the etching target film, a pattern of the second sidewall formed by the silicon oxide film, a CD of the etching target film pattern was 24.9 nm and LER was 2.6 nm.

Accordingly, it is found that the pattern having the line-and-space structure formed by the pattern forming method according to the present embodiment has LER similar to that of the second organic film pattern having the original line-and-space structure. Namely, the pattern forming method according to the present embodiment enables self-aligned multiple patterning with reduced LER.

As disclosed herein, it is possible to provide a pattern forming method that enables self-aligned multiple patterning with reduced LER.

Further, the present invention is not limited to these embodiments, but various variations and modifications may be made without departing from the scope of the present invention.

What is claimed is:

1. A pattern forming method comprising steps of:
   forming a first organic film by coating an etching target film with a composition including a polymer including a cross-linkable component;
   infiltrating an inorganic substance into the first organic film;
   cross-linking the polymer;
   forming a second organic film on the first organic film after the steps of infiltrating and cross-linking;
   forming a second organic film pattern by patterning the second organic film;
   forming a first organic film pattern having a pitch reduced to one-half of a pitch of the second organic film pattern by patterning the first organic film by a self-aligned patterning method that uses the second organic film pattern as a core pattern; and
   forming an etching target film pattern having a pitch reduced to one-half of a pitch of the first organic film pattern by patterning the etching target film by a self-aligned patterning method that uses the first organic film pattern as a core pattern.

2. The pattern forming method according to claim 1, wherein the step of forming the second organic film pattern includes
   forming a resist film on the second organic film,
   forming a resist pattern by patterning the resist film, and
   etching the second organic film by using the resist pattern as an etching mask.

3. The pattern forming method according to claim 1, wherein the step of forming the first organic film pattern includes
   forming a silicon oxide film to cover the second organic film pattern;
   forming a first sidewall of the silicon oxide film on each side of the second organic film pattern by etching the silicon oxide film formed on an upper surface of the second organic film pattern;
   removing the second organic film pattern; and
   etching the first organic film by using the first sidewall as an etching mask.

4. The pattern forming method according to claim 1, wherein the step of forming the etching target film pattern includes
   forming a silicon oxide film to cover the first organic film pattern;
   forming a second sidewall of the silicon oxide film on each side of the first organic film pattern by etching the silicon oxide film formed on an upper surface of the first organic film pattern;
   removing the first organic film pattern; and
   etching the etching target film by using the second sidewall as an etching mask.

5. The pattern forming method according to claim 1, wherein the step of cross-linking is performed after the step of infiltrating.

6. The pattern forming method according to claim 1, further comprising a step of,
   annealing the first organic film after the steps of infiltrating and cross-linking and before the step of forming the second organic film.

7. The pattern forming method according to claim 1, wherein the step of infiltrating includes
   exposing the first organic film to a gas containing the inorganic substance, and
   exposing the first organic film to water vapor.

8. The pattern forming method according to claim 7, wherein the inorganic substance is silicon.

9. The pattern forming method according to claim 8, wherein 5 to 10 atom % of silicon is infiltrated into the first organic film by repeating the steps of exposing the first organic film to the gas containing the silicon and exposing the first organic film to the water vapor.

10. The pattern forming method according to claim 1, wherein the polymer is obtained by polymerizing a monomer having a hydroxy group.

11. The pattern forming method according to claim 10, wherein the hydroxy group is a phenolic hydroxy group or an alcoholic hydroxy group.

12. The pattern forming method according to claim 1, wherein the composition includes a cross-linking agent.

13. The pattern forming method according to claim 12, wherein the cross-linking agent is a methylol group-containing compound, an alkoxyalkyl group-containing compound, a carboxymethyl group-containing compound, or an epoxy compound.

14. The pattern forming method according to claim 1, wherein the composition includes an acid or an acid generator.

15. The pattern forming method according to claim 14, wherein the acid is an organic sulfonic acid or an organic carboxylic acid.

16. The pattern forming method according to claim 14, wherein the acid generator is a thermal acid generator or a photoacid generator.

17. The pattern forming method according to claim 14, wherein the acid generator is an amine salt of an organic sulfonic acid or an amine salt of an organic carboxylic acid.

* * * * *